(12) United States Patent
Bergemont et al.

(10) Patent No.: US 7,944,750 B1
(45) Date of Patent: May 17, 2011

(54) MULTI-PROGRAMMABLE NON-VOLATILE MEMORY CELL

(75) Inventors: Albert Bergemont, Palo Alto, CA (US); David Kuan-Yu Liu, Fremont, CA (US); Venkatraman Prabhakar, Pleasanton, CA (US); Sridevi Rajagopalan Schmidt, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 211 days.

(21) Appl. No.: 12/288,762

(22) Filed: Oct. 22, 2008

(51) Int. Cl.
*G11C 16/04* (2006.01)
(52) U.S. Cl. .......... 365/185.18; 365/185.03; 365/185.05
(58) Field of Classification Search ............. 365/185.18, 365/185.03, 185.05; 257/315, 371
See application file for complete search history.

(56) References Cited

U.S. PATENT DOCUMENTS

| 5,844,347 | A | 12/1998 | Takayama et al. |
| 6,307,447 | B1 | 10/2001 | Barber et al. |
| 2004/0115881 | A1 | 6/2004 | Choi et al. |
| 2005/0030827 | A1* | 2/2005 | Gilliland et al. ............... 365/232 |
| 2005/0270850 | A1* | 12/2005 | Wang et al. ............... 365/185.28 |
| 2006/0244043 | A1* | 11/2006 | Wang et al. .................... 257/315 |

FOREIGN PATENT DOCUMENTS

JP 2004-135163 A 4/2004

OTHER PUBLICATIONS

Tapani Makkonen, Tuomas Pensala, Juha Vartiainen, Jouni V. Knuuttila, Jyrki Kaitila, Martti M. Salomaa, "Estimating Materials Parameters in Thin-Film BAW Resonators Using Measured Dispersion Curves," Jan. 2004, pp. 42-51, IEEE, vol. 51., No. 1.

* cited by examiner

*Primary Examiner* — Huan Hoang
(74) *Attorney, Agent, or Firm* — Haverstock & Owens, LLP (57) ABSTRACT

A non-volatile memory device and method for manufacture and programing which does not require a control gate for the programing or erasure of the device. The memory device is comprised of two wells with the opposite conductivity type of the semiconductor body. In one of the wells is a source and drain well of the same conductivity type as of the body. A oxide is formed on the surface of the body on which a floating gate is formed. Specific voltages are applied to the source, drain, first well and second well region to program, erase and read the memory device.

21 Claims, 9 Drawing Sheets

MULTI-PROGRAMMABLE NON-VOLATILE MEMORY CELL

FIELD OF THE INVENTION

This invention is related to non-volatile reprogramable semiconductor memory devices and methods for the fabrication thereof.

BACKGROUND OF THE INVENTION

Semiconductor devices require a series of fabrication processing steps in the production of a device. The steps can include the formation of layers of oxide, interconnect material, and thin film materials, and diffusion into a layer or substrate. Each layer requires the steps of, masking, etching away of unwanted material, and subsequent cleaning. These steps requires time, materials, and processing equipment to perform. Further, these steps can damage the device and thus reduce the device yield from a substrate. Thus, if multiple types of semiconductor devices are fabricated on the same substrate, the requirement for any additional layers increase the overall cost of producing each device.

Figure 1:
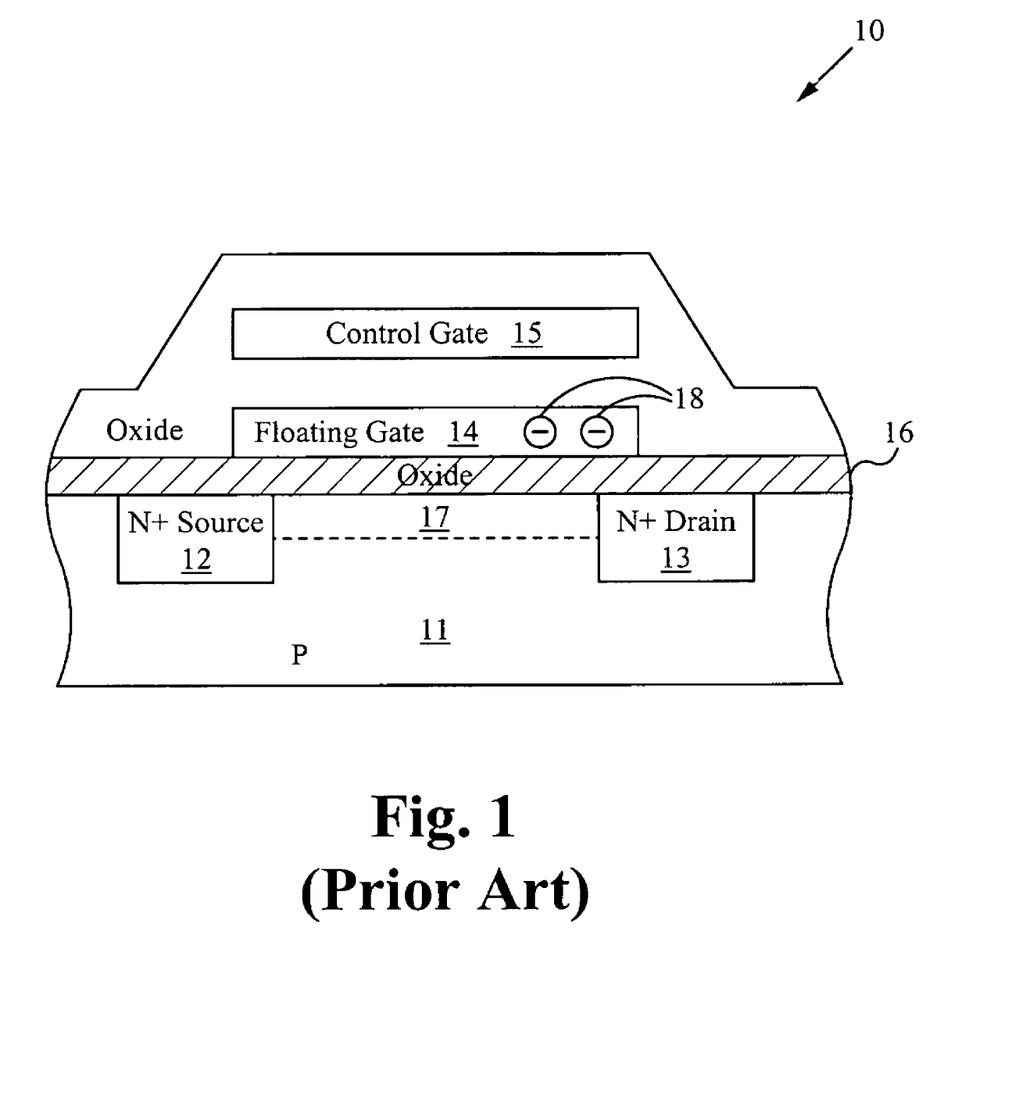
FIG. 1 illustrates a cross section of a conventional flash memory cell.

FIG. 1 illustrates a standard memory cell 10 for flash memory, a type of reprogrammable non-volatile memory. Flash memory operates on the principle of using a MOS transistor with a floating gate 14 to selectively store a charge. The operation of the channel 17 in the MOSFET will change upon whether a charge is stored on the floating gate. The effect on the conductivity of the MOSFET channel is detectible and thus the state of the memory cell, either a logical 1 or 0, is detectable by read logic (not shown). The MOSFET transistor can be of the type of either N-channel or P-channel. FIG. 1 shows an N-channel device. For the purposes of clarity, structures required to isolate one memory cell from another memory cell or other devices are not included in the description. Further, the description excludes the required circuitry for reading the programed state of the memory device.

It is often desirable to fabricate different types of semiconductor devices on a single substrate. Such a combined device fabrication can reduces packaging costs, produces an overall smaller combined device footprint, decreases signal delay times between components and thus faster operating speeds, and reduces power requirements through reduced chip interfaces and the associated signal drivers. However, different types of semiconductor devices such as logic and flash memory require a different number of processing steps. For example, a conventional flash memory typically requires the formation of an additional layer from which a floating gate is formed and thus requires the additional steps and costs of masking and oxidation for the extra gate formation. Thus, the benefits are obvious of producing reprogrammable non-volatile memory and other semiconductor devices and on the same semiconductor substrate that can be fabricated the same processing steps and/or processing layers as other types of semiconductor devices. One drawback of using the same oxide layers for both a non-volatile memory device and another semiconductor device (logic devices, analog devices, microcontrollers), is that the oxide layer thickness optimal for one type of device is not likely to be optimal for forming a non-volatile memory device with a high program/erase cycle capability. The thinner oxides use for logic devices or microcontrollers can be damaged by the program/erase cycle and these memory are only good for less than a hundred program/erase cycles. However, there is a class of applications where a non-volatile memory device with a limited program/erase cycle capability is still useful. Such applications might include setting an encryption key or programing an identification number. What is needed is a device and fabrication method that forms a reprogrammable non-volatile memory without requiring additional layers or processing steps beyond what is required by an addition type of semiconductor device, such as logic, analog, micro-controller/processor, or graphics processing devices, formed on the same substrate.

SUMMARY OF THE INVENTION

In a first aspect of the present invention, a non-volatile memory integrated circuit device comprises of a body of semiconductor material predominantly of one conductivity type, a first well region, a second well region, a source well region, a drain well region, and a floating gate. The semiconductor body is predominately one conductivity type; either N-type or P-type semiconductor. The first and second well regions are formed extending from one side of the semiconductor body. The first and second well regions are formed so that they do not overlap forming two separate wells. The conductivity type of the first and second wells are the opposite of the semiconductor body. Within the first well region a source well region and drain well region are formed extending from the same side of the semiconductor body as the first and second well regions. The conductivity type of the source and drain well regions are the same as the semiconductor body conductivity. The source and drain well regions do not overlap and the region between the source and drain well regions form a channel through which current flows in accordance with the charge on the floating gate. On the surface of the semiconductor body, from the same side that the first and second well regions are formed, is a layer of insulation material, preferably silicon dioxide. On the insulation layer is a floating gate. The floating gate should substantially spans the distance between the source and drain well region and additionally substantially spans the second well region. In one embodiment of the invention, the semiconductor body is P-type conductivity, the first and second well regions are N-type conductivity, and the source and drain well regions are P-type conductivity. In another embodiment of the present invention, the semiconductor body is N-type conductivity, the first and second well regions are P-type conductivity, and the source and drain well regions are N-type conductivity. In another embodiment, the second well region is configured to take a voltage that is less than a power supply voltage (Vcc), preferably 2.0 volts. The advantage of the second well region being configured to take a voltage less than the power supply voltage (Vcc) is that the voltage for the second well region can be derived from the power supply voltage (Vcc) without the need for a charge pump or an external voltage supply. This voltage is required for the second well region to program the memory device. In another embodiment of the present invention, the thickness of the insulation layer can range from 30-100 angstroms, preferably 70 angstroms. In another embodiment of the present invention, the memory device is formed in a common substrate with one or more different types of semiconductor devices. These semiconductor devices can include analog devices, digital logic devices, micro-processors or micro-controllers, and graphic processing devices where the memory device and the other semiconductor device(s) share commonly produced structures such as oxide layers and fabrication steps such as well diffusion, or layer deposition.

In a second aspect of the invention is a method of programing the memory device as described above. The method of programming the memory device is comprised of the steps of applying a program voltage to the first well region and the source well region, a program bias voltage is applied to the second well region and a substantially grounded voltage is applied to the drain. The program voltage can be between 6.0-7.0 volts, preferably 6.5 volts. The program bias voltage can be between 1.9-2.2 volts, preferably 2.0 volts. The substantially grounded voltage can be between 0.0-0.3 volts, preferably 0.0 volts.

In a third aspect of the present invention is a method of erasing the memory device as described above. The method of erasing the memory device is comprised of the steps of applying an erase voltage to the first well region, the drain well region, and the source well region. The second well region is substantially grounded. The erase voltage can be between 12.0-16.0 volts, preferably 13 volts. The substantially grounded voltage can be between 0.0-0.3 volts, preferably 0.0 volts. The substantially grounded voltage can be between 0.0-0.3 volts, preferably 0.0 volts.

In a fourth aspect of the present invention is a method of reading of a memory device as described above. The method of reading the memory device is comprised of the steps of applying an circuit source voltage to the source well region, and the first well region. A voltage less than the circuit source voltage is applied to the drain. The second well region is substantially grounded. The voltage less than the circuit source voltage can be between 2.2 and 4.5 volts, preferably 1.0 volts less than the circuit source voltage or 4.0 volts. The circuit source voltage can be between 3.2-5.5 volts, preferably 5 volts. The substantially grounded voltage can be between 0.0-0.3 volts, preferably 0.0 volts.

It will be appreciated by one skilled in the art that within the methods of programming, erasing, and reading the memory device that the specified voltages can be supplied substantially simultaneously or in a different orders. It will also be appreciated that voltages described as being the same applied voltage can vary slightly from each other.

A fifth aspect of the present invention is a method of fabrication of a memory device. The steps are comprised of forming a body of semiconductor material, predominantly of one conductivity type, forming a first and second well region in the semiconductor body of the opposite conductivity type from the semiconductor body where the first and second well regions extend from one of the semiconductor body surfaces. In the first well region, a source and drain well region are formed of the same conductivity type as the body of semiconductor material, and extending from the same surface as the first and second well. Further an insulation layer is formed on the surface of the semiconductor body on the side from which the wells are formed. On the insulation layer is formed a floating gate that is electrically insulated. Preferably, the memory device has an semiconductor body of predominantly P-type conductivity, the first and second well regions having a predominately N-type conductivity, and the source and drain well regions having a predominately P-type conductivity. However, a different conductivity configuration is contemplated; such as the memory device with an semiconductor body with a predominantly N-type conductivity, the first and second well region with a predominately P-type conductivity, and the source and drain well regions having a predominately N-type conductivity. Preferably, the first and second well regions do not over lap. Preferably the source and drain well regions do not overlap and form a channel between them, adjacent to the oxide layer, where the conductivity of the channel is effected by presences or absence of an electric charge stored on the floating gate. Preferably the insulation layer between the floating gate and the surface of the semiconductor body is 70 angstroms thick but thickness ranging from 30-100 angstroms are contemplated. In one embodiment of the invention, it is contemplated that the memory device described above is formed in a semiconductor substrate along with at least one other another semiconductor device including but not limited to logic, analog, microprocessor, microcontroller, or graphic processing devices where the memory device is formed within the steps and within the same layers as the additional semiconductor device(s).

BRIEF DESCRIPTION OF THE DRAWINGS

The invention is better understood by reading the following detailed description of an exemplary embodiment in conjunction with the accompanying drawings.

DETAILED DESCRIPTION OF THE INVENTION

The following description provides an enabling teaching of the invention in its best, currently known embodiment. Those skilled in the relevant art will recognize that many changes can be made to the embodiment described, while still obtaining the beneficial results of the present invention. It will also be apparent that some of the desired benefits of the present invention are obtainable by selecting some of the features of the present invention without utilizing other features. Accordingly, those who work in the art will recognize that many modifications and adaptions to the present inventions are possible and may even be desirable in certain circumstances, and are a part of the present invention. Thus, the following description provides an illustrative representation of the principles of the present invention and not in limitation thereof, since the claims define the scope of the present invention.

A flash memory device operates by using the presence or absence of an electron charge 18 on the floating gate 14 to determine whether a logical one or zero is stored in the memory cell. The programming of the memory cell is implemented by applying a voltage to the control gate 15 which causes electrons to tunnel through the protection oxide 16 and become trapped on the floating gate 14. The trapped electrons 18 generate an electric field between the floating gate 14 and trapped electrons effects formation of a channel between the source 12 and the drain 13. the channel 17 between the source 12 and the drain 13. To program a flash memory cell, a positive programming electrical voltage is applied to the control gate 15 and drain 13. For the present invention the programming voltage is 12 volts. The source 12 is grounded.

These applied voltages create a relatively strong electric field across to allow electrons to cross the insulator and become trapped on the floating gate 14. Because of the electric field between the control gate 15 and the channel 17, electrons traveling from the source 12 to the drain 13 will be subject to an effect referred to as hot electron injection. The electrons, because of the voltage gradient, will tunnel through the oxide 16 and be trapped on the floating gate 14. These trapped electrons 18 will then cause an electric change that effects the channel 17. Without the trapped charge applying an appropriate gate voltage will cause a channel to be formed between the source 12 and the drain 13. However, when change is trapped on the floating gate 14, applying the same gate voltage will not result in formation of a channel. The electrons 18 create an electrical change that tends repel electrons in the channel 17 and thus inhibits the flow of electrons from the source 12 to the drain 13. This change in current is detectable by the read circuitry and thus a logical 0, i.e. electrons 18 stored on the floating gate 14, is detectable. The erasure of a flash memory cell 10 is accomplished by grounding the control gate 15 while applying ground to the source 12 and a high voltage (12 volts) to the drain 13. The large positive voltage on the drain 12 attracts the electrons 18 trapped on the floating gate 14. Because of quantum mechanical tunneling, the electrons 18 will tunnel through the oxide 16 and the memory cell 10 will be set to a logical 1.

Figure 2A:
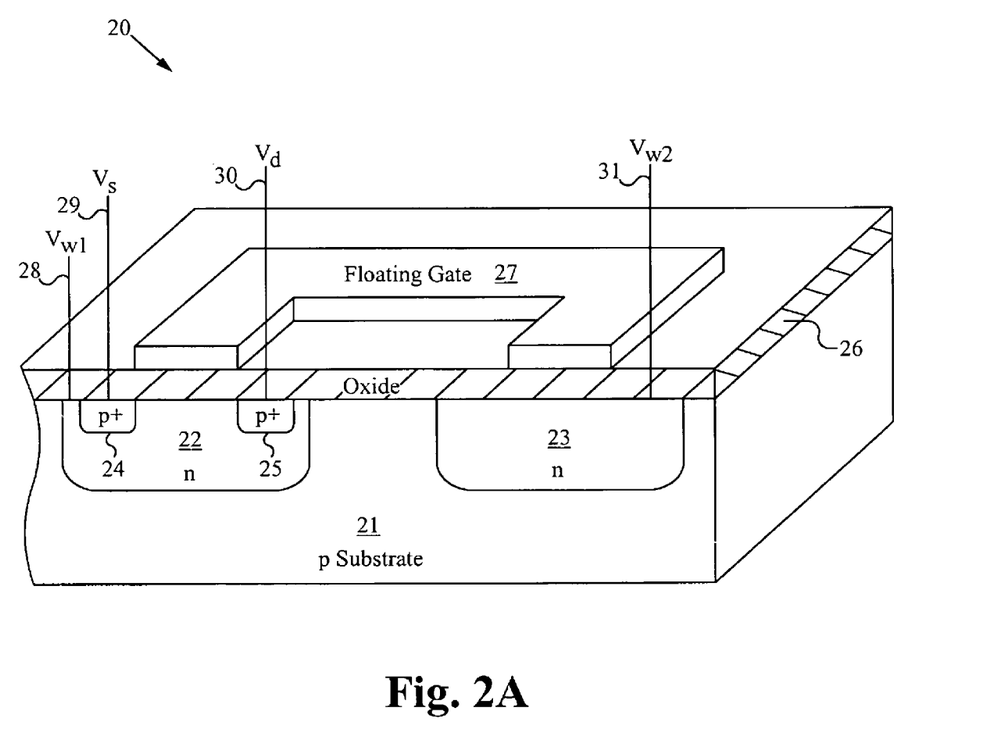
FIG. 2A illustrates a cross section of a non-volatile memory cell in accordance with the present invention.

FIG. 2A illustrates the preferred embodiment of a non-volatile reprogrammable memory cell 20. Not shown is the logic required to read the logic state of the memory cell; conventional read logic can be used. The present embodiment of the memory cell 20 is formed in a substrate 21 that is predominately P-type conductivity. Within the substrate are formed a first well region 22 and a second well region 23 which are both predominately N-type conductivity. Within the first well region 22 two additional wells of the opposite conductivity, P-type, are formed. The first P-type well region forms the source 24 and the second P-type well region forms the drain 25 of a MOSFET type transistor. However, instead of a 27 gate formed over the floating gate the second well region 23 controls the floating gate to as the control gate.

Both source 24 and drain 25 wells are formed entirely within the first N-type well region 22.

When no electrons are trapped on a the floating gate 27, a control voltage applied to the second well 23 and operates to form a channel. Between the source 24 and the drain 25 through which current can flow depending on the electric field asserted by the floating gate 27 and the voltages on the source well 24 and drain well 25. When electrons are trapped on the floations gate 27, the control voltage applied to the second well region 23 will fall to form a channel. An oxide layer 26 provides support for the floating gate 27 and electrical isolation for holding a charge on the floating gate 27. The oxide is preferably 70 angstroms thick, but other thickness are contemplated. Thicknesses of 40-200 angstroms are contemplated. Thicker oxides 26 will support a larger number of program and erase cycles. As is discussed later, the high required erase voltage has the potential to break down the oxide 26 between the floating gate 27 and the first well region 22 and thus rendering the memory cell 20 inoperative.

The thickness of the oxide 26 can be adjusted according to the processing requirements of the most prevalent type of device formed on the substrate 21. When a device is formed on the same substrate as a memory cell, the oxide layers are typically thinner than would be found for a device with only floating gate memory. So if the substrate is formed with logic devices where the standard oxide layer is 70 angstroms, then the floating gate 27 of the memory device 20 is separated from the substrate by the same oxide layer 26 thickness. Oxide layers 70 angstroms thick limits the program/erase cycles of the memory cell to around a hundred. However, for many applications this limit on programing/erase cycles is adequate.

Figure 2B:
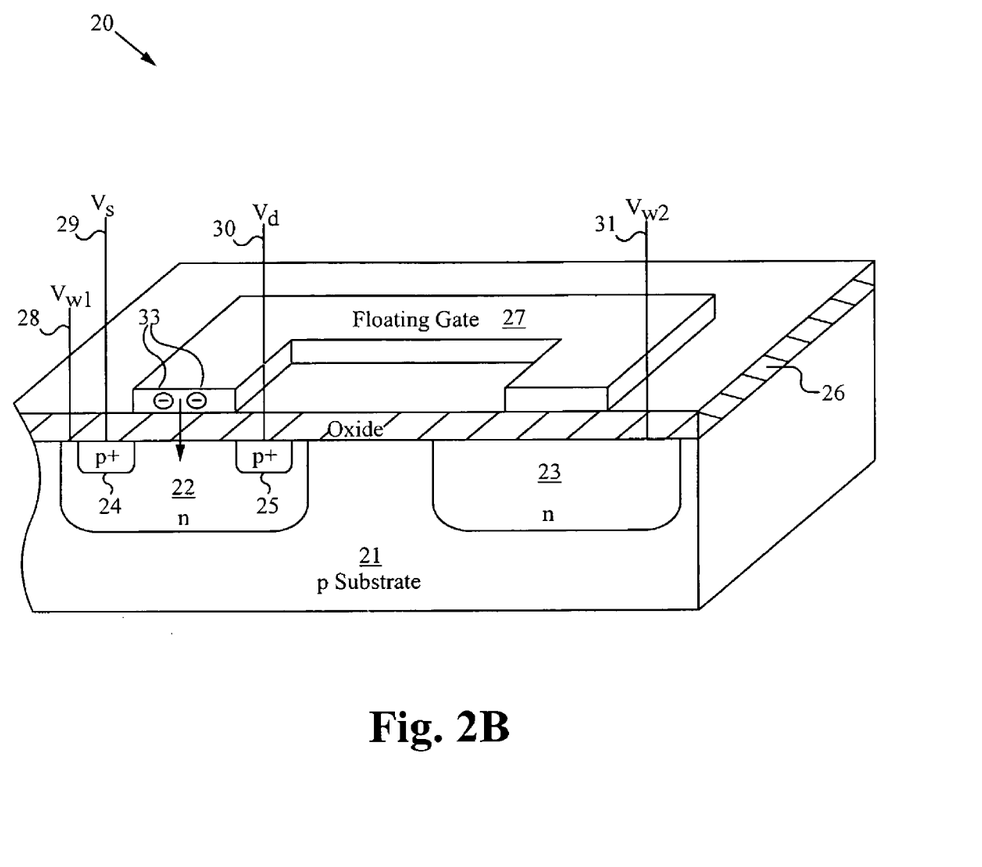
FIG. 2B illustrates a cross section of a non-volatile memory cell in accordance with the present invention during an erase operation.

FIG. 2B illustrates the operation of the non-volatile first memory device 20 during an erase cycle. The erase cycle puts the memory device 20 into a state where charge stored on the floating gate 27 is removed. Ideally, if the change is removed in an erase, but removal of a significant portion of the charge will usually be sufficient. The erase voltage, a high positive voltage is placed on $V_{w1}$ 28, $V_s$ 29, and $V_d$ 30 which in turn places the erase voltage on the first well region 22, the source well region 24 and the drain well region 25. The erase voltage can range from 12.5-16.0 volts, preferably 13.0 volts. A low voltage, preferably ground, is placed on $V_{w2}$ 31 which in turn substantially grounds the second well region 23. The grounded second well region 23 induces a low voltage potential onto the floating gate 27. Thus, the region between channel in the first well region 22 and the floating gate 27 has a strong electrical gradient that attracts the electrons 33 trapped on the floating gate 27. The electrons 33 tunnel through the oxide 26, and thus a significant portion of the excessive trapped electrons 33 producing a charge on the floating gate 27 are removed. This sets the state of the memory device 20 to a first logical state. Voltages ($V_{w2}$) greater than ground can be used on the second well region 23 but will slow the tunneling process down: Too large of a voltage ($V_{w2}$) on the second well region 23 will stop the electron tunneling process and thus stop the erase process.

Figure 2C:
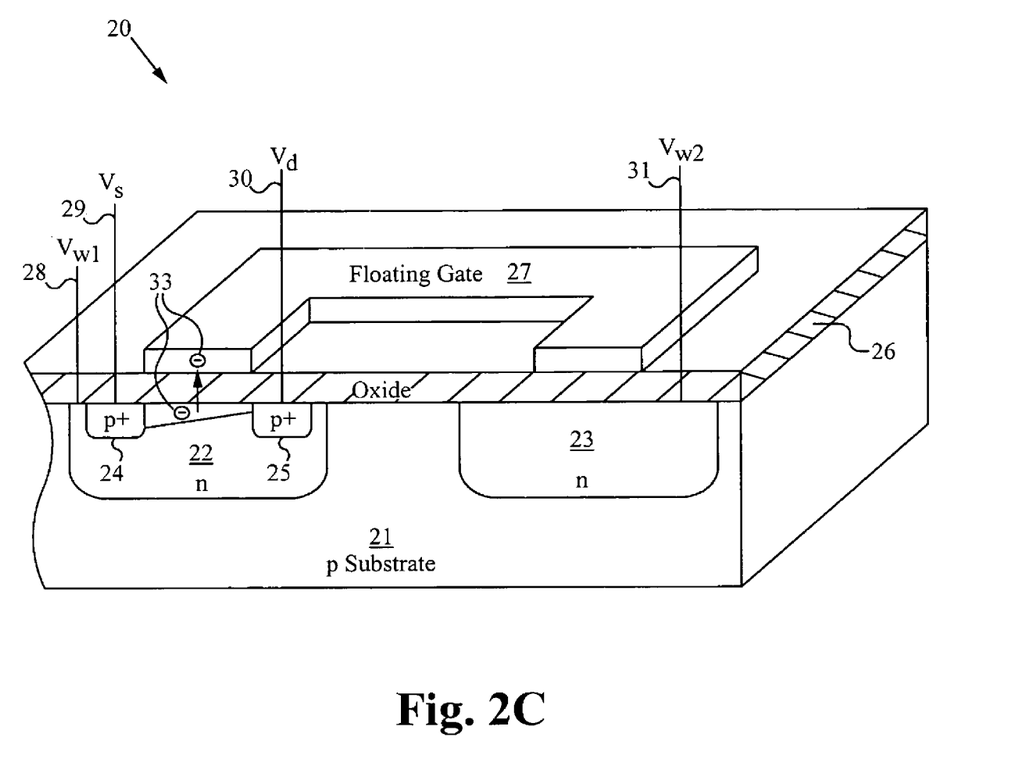
FIG. 2C illustrates a cross section of a non-volatile memory cell in accordance with the present invention during an program operation.

FIG. 2C illustrates the operation of the non-volatile memory device 20 during a program cycle. The program cycle puts the memory device 20 into a second logical state where a charge of electrons 33, is stored on the floating gate 27. The source voltage 30 ($V_s$), and the first well voltage 28 ($V_{w1}$) are set to a positive voltage, preferably 6.5 volts. The drain voltage 30 ($V_d$) is set to a low voltage, preferably ground. The second well voltage 31 ($V_{w2}$) is set to a positive voltage, preferably 2 volts. The positive source voltage 29 (V) and first well voltage 28 ($V_{w1}$) and a grounded drain voltage 30 ($V_d$) induces a conduction channel 34 between the source and the drain. As configured, electrons 33 flow between the drain and the source. A positive second well voltage 31 ($V_{w2}$) induces a positive voltage onto the floating gate 27. Because the drain 25 is at ground and the floating gate 27 is at 2.0 volts, this differential causes the phenomena of hot electron injection where the electrons 33 are injected through the oxide 26 onto the floating gate 27 as shown by the arrow. These electrons 33 are trapped on the floating gate 27 and sets the memory device to a second logical state. In some embodiments, the first logical state is a logical 0, and the second level state is a logical 1. The opposite logical states can also be used.

Figure 2D:
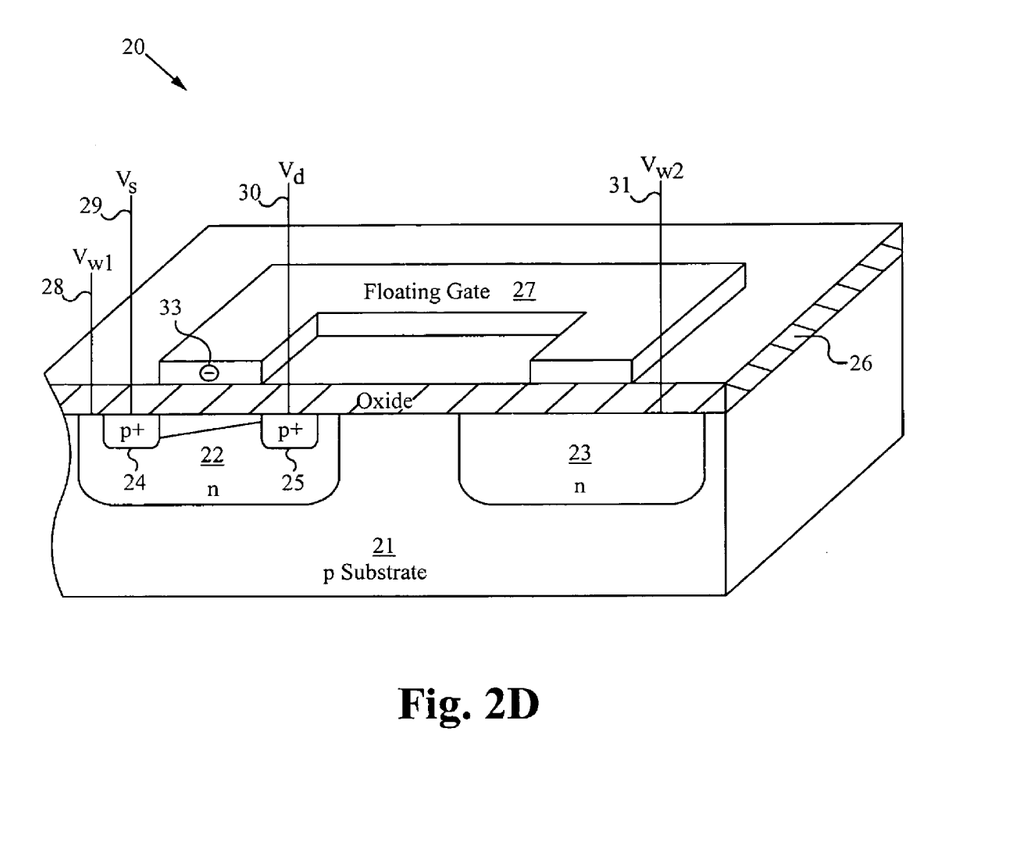
FIG. 2D illustrates a cross section of a non-volatile memory cell in accordance with the present invention during a read operation.

FIG. 2D illustrates the memory device when being read. The voltage sources $V_s$ 29, and $V_{w1}$ 28, are set to the power supply voltage (V) which in turn places the power supply voltage $V_{cc}$ on the source well region 25, and the first well region 22. The power supply voltage can range from 3.2-5.5 volts, preferably 5.0 volts. The voltage source $V_{w2}$ 31 is substantially grounded which in turn grounds the second well region 23. The drain voltage source $V_d$ 30, which in turn places $V_d$ on the drain well region 25, is set to a level below the power supply voltage ($V_{cc}-1$), preferably 4.0 volts. The voltage between the source well region 24 and the drain well region 25 induces current to flow through the channel 34 along the interface of the first well region 22 and the insulation layer 26. The channel size and thus the current flow depends on the charge stored in the floating gate 27. For an N-type first well region 22, free electrons are available in the N-type semiconductor and thus a channel current flows under the specified source 24 drain 25 biasing. However, if electrons 33 are trapped on the floating gate 27, then the electric field produced by the electrons 33 will repel the channel electrons depleting part of the channel, and thus reduce or prevent the current flow. Because of the differences in the read configuration current flow, depending on the floating gate 27 electron charge, the state of the memory cell (logical 1 or 0) can be determined by read circuitry (not shown). As illustrated, the floating gate 27 has trapped electrons 33, with partial depletion of the channel 34.

Figure 3A:
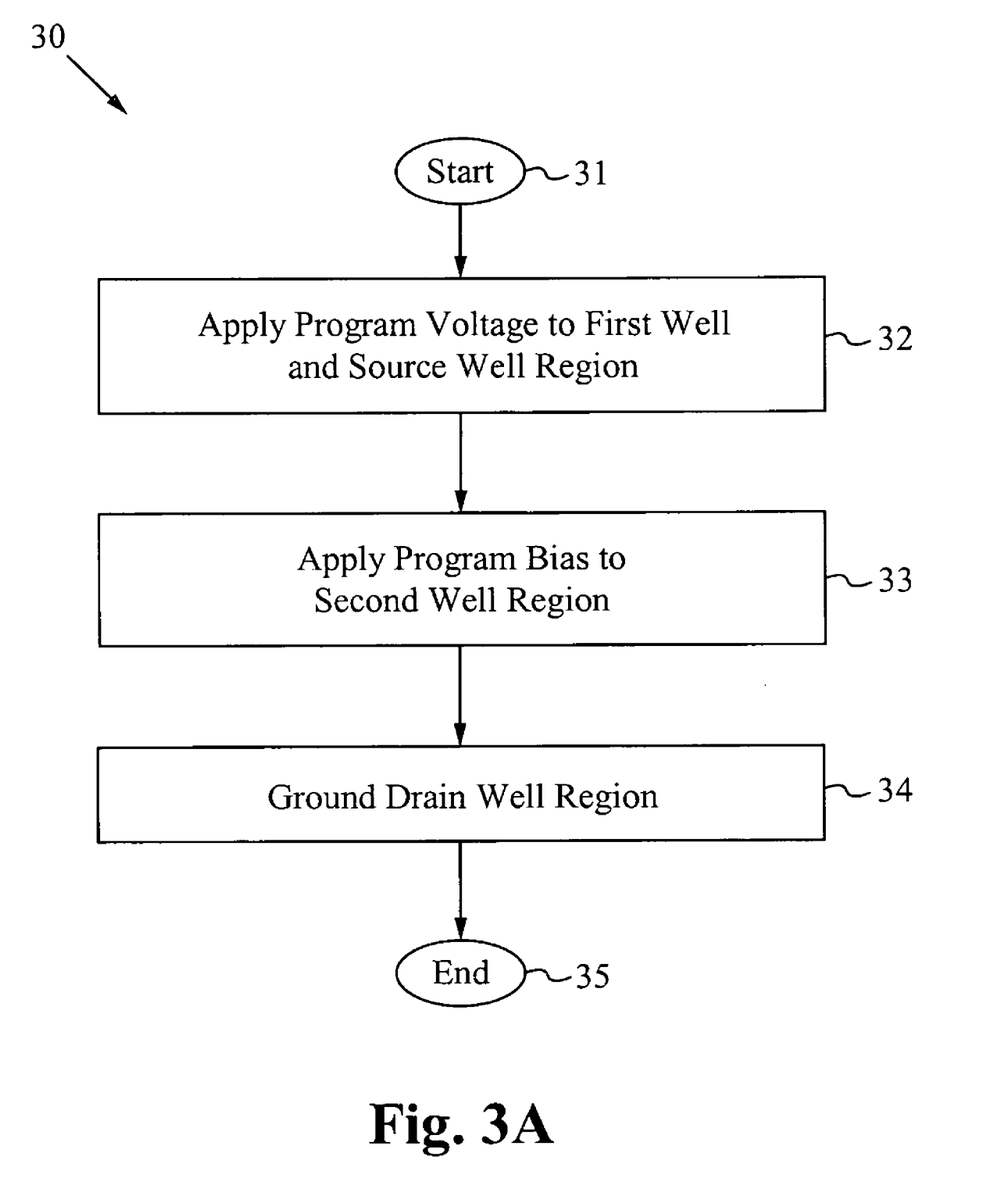
FIG. 3A illustrates the method of performing a program operation according to the present invention.

FIG. 3A illustrates a method of programing 30 the memory device in accordance with one embodiment of the present invention. For illustrative purposes, the description of this method make reference to the structural items as shown in FIG. 2C. In a step 31, the procedure 30 begins. One skilled in the art will appreciate that this step can include the configuration of any other circuits and voltages as required for the operation of the memory device 20 programming method. In the step 32, a program voltage is applied to the first well region 22 and the source well region 24. This voltage can be in the range of 6.0 to 7.0 volts, preferably 6.5 volts. In the step 33, a program bias voltage is applied to the second well region 23. The voltage can range from 1.9-2.2 volts, preferably 2.0 volts. In the step 34, the drain well region 25 is grounded. The ground voltage can range from 0.0-to 0.3 volts, preferable 0.0 volts. In step 35, the method of programming the memory device is ended. One skilled in the art will appreciate that this step could include the removal of the programming voltages and reconfiguration of any circuit or voltage sources as required. It will further be appreciated that the steps (32, 33, and 34) for programming the memory device 20 can be performed in any order and preferably essentially concurrent with each other.

Figure 3B:
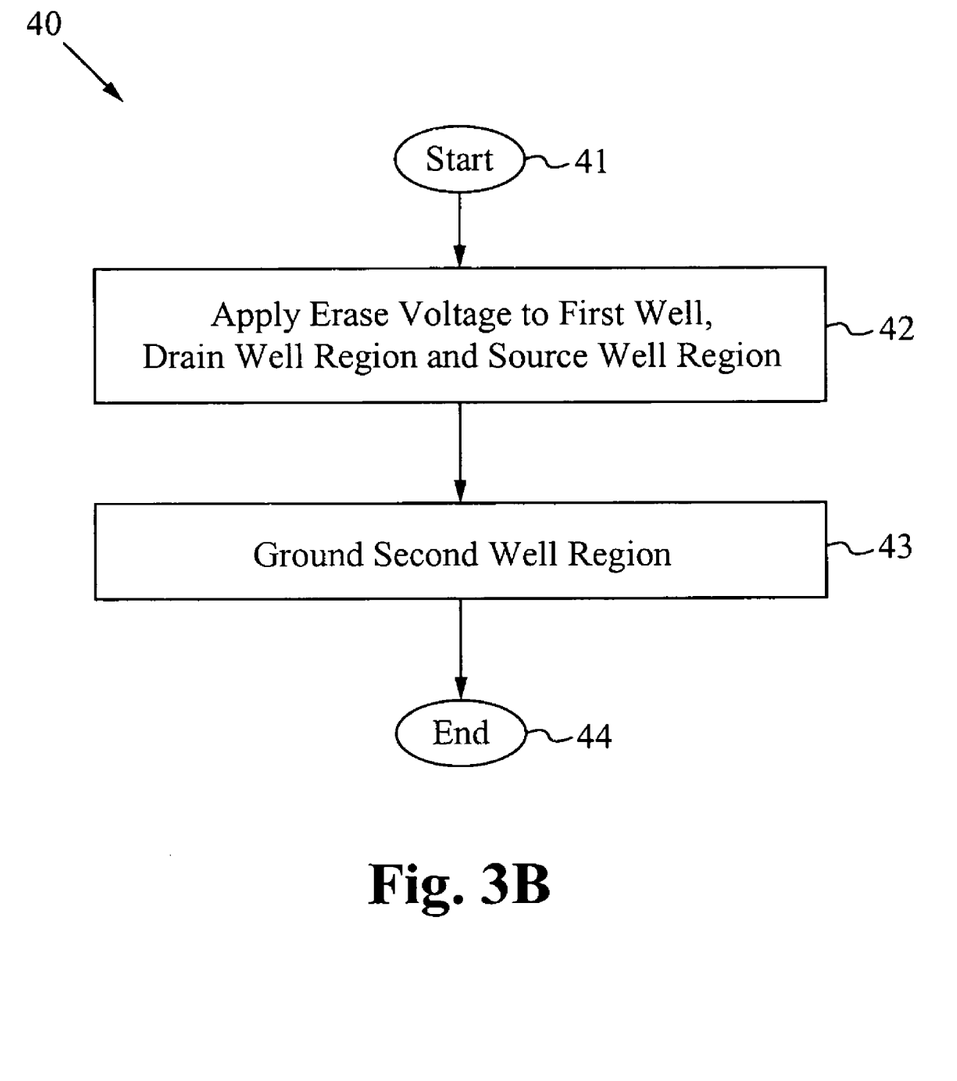
FIG. 3B illustrates the method of performing an erase operation according to the present invention.

FIG. 3B illustrates a method of erasing 40 the memory device in accordance with one embodiment of the present invention. For illustrative purposes, the description of this method make reference to the structural items as shown in FIG. 2B. In a step 41, the procedure 40 begins. One skilled in the art will appreciate that this step could include the configuration of any other circuits and voltages as required for the operation of the memory device erasing method. In the step 42, an erase voltage is applied to the first well region 22, the source well region 24, and the drain well region 25. The erase voltage can be in the range of 12.5 to 16.0 volts, preferably 13.0 volts. In the step 43, the second well region 23 is grounded. The ground voltage can range from 0.0 to 0.3 volts, preferable 0.0 volts. In step 44, the method of erasing the memory device 20 is ended. One skilled in the art will appreciate that this step could include the removal of the erase voltages and reconfiguration of any circuit or voltage sources as required. It will further be appreciated that the steps (42 and 43) for erasing the memory device 20 can be performed in any order and preferably essentially concurrent with each other.

Figure 3C:
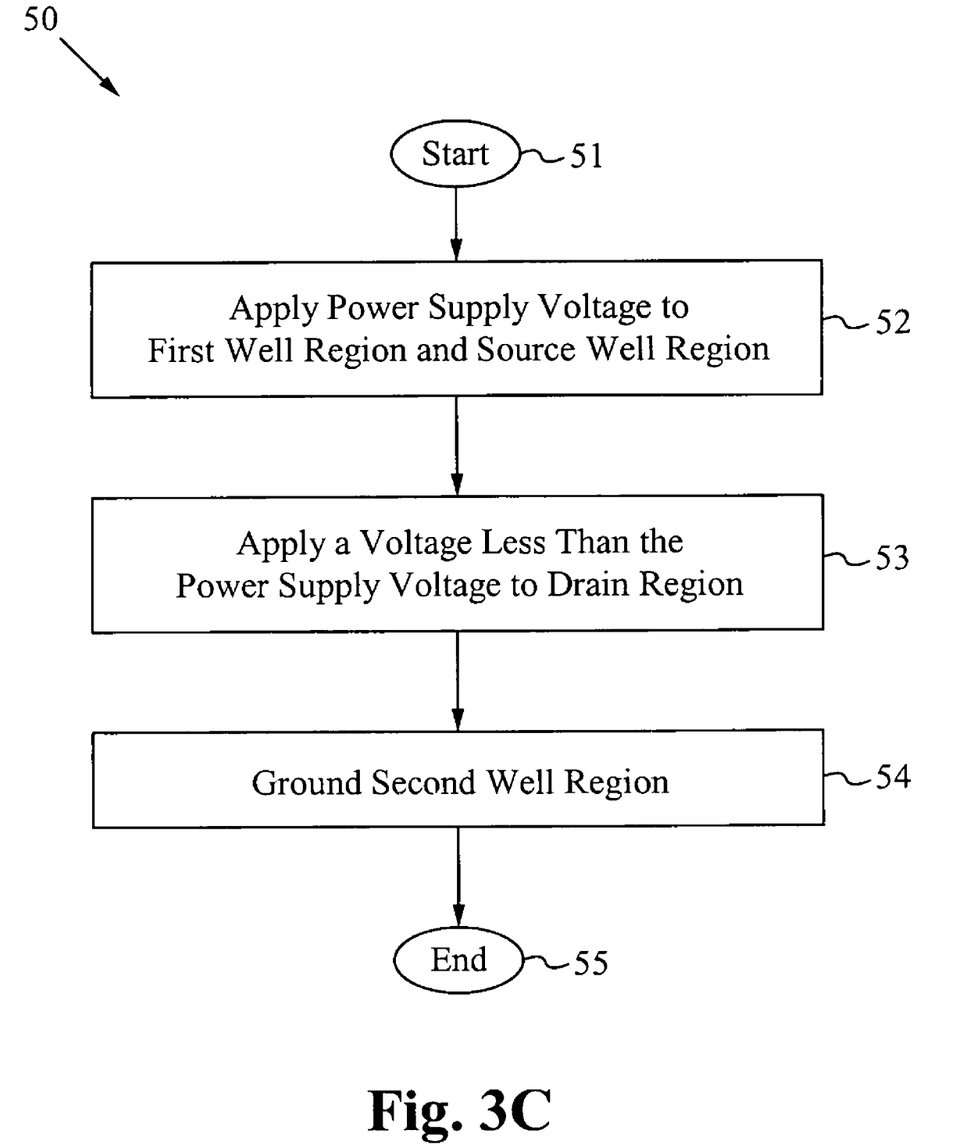
FIG. 3C illustrates the method of performing a read operation according to the present invention.

FIG. 3C illustrates a method of reading 50 the memory device 20 in accordance with one embodiment of the present invention. For illustrative purposes, the description of this method make reference to the structural items as shown in FIG. 2D. In the step 51, the procedure 50 begins. One skilled in the art will appreciate that this step could include the configuration of any other circuits and voltages as required for the operation of the memory device read method. In the step 52, a power supply voltage ($V_{cc}$) is applied to the first well region 22 and the source well region 24. This voltage can be in the range of 6.0 to 7.0 volts, preferably 6.5 volts. In the step 33, a voltage lower than the power supply voltage ($V_{cc}$−1) is applied to the drain well region 25.

The drain 31 voltage can range from $V_{cc}$−1.2 to $V_{cc}$−0.8 volts, preferably $V_{cc}$−1 volts. In the step 54, the second well region 23 is grounded. The grounded voltage can range from 0.0-to 0.3 volts, preferable 0.0 volts. In step 55, the method of reading the memory device 20 is ended. One skilled in the art will appreciate that this step could include the removal of the programming voltages and reconfiguration of any circuit or voltage sources as required. It will further be appreciated that the steps (52, 53, and 54) for programming the memory device can be performed in any order and preferably essentially concurrent with each other.

Figure 4:
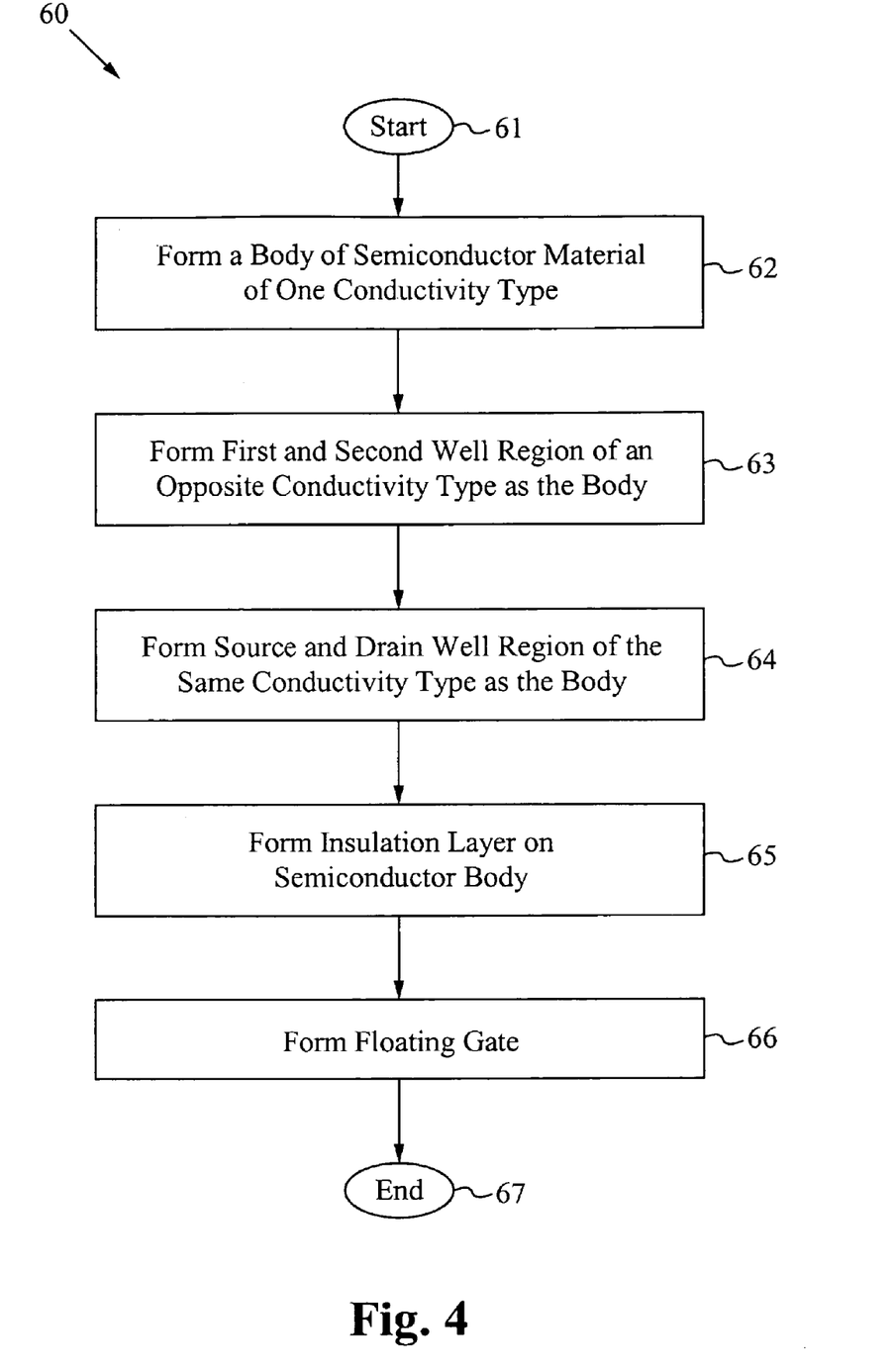
FIG. 4 illustrates the method of fabrication of the memory device.

FIG. 4 illustrates a method of fabrication 60 the memory device in accordance with one embodiment of the present invention. For illustrative purposes, the description of this method make reference to the structural items as shown in FIG. 2A. In the step 61, the fabrication procedure 60 begins. This step can include any preparation or cleaning of a body of semiconductor material. In the step 62, the body of semiconductor material 21 of one conductivity type is formed, preferably P-type. In the step 63, a first well region 22 and second well region 23 is formed in the substrate 21 with a conductivity type that is opposite of the body of semiconductor material, preferably N-type. The first well 22 and second well regions 23 do not overlap and further are formed from one side of the semiconductor body 21. In the step 64, a source well region 24 and drain well region 25 are formed in the first well region 22 and are separated by a distance. The conductivity type of the source well region 24 and drain well region 25 are the same as the body of semiconductor material 21, preferably P-type. In the step 65, an insulation layer 26 is formed on the surface of the body of semiconductor material 21. The oxide 26 is formed on the same side from which the well regions extend into the body. In the step 66, a floating gate 27 is formed on the oxide layer 26.

One skilled in the art will appreciate that standard semiconductor processing techniques can be used for the formation of the wells, layers of oxide, and gates using but not limited to standard masking, diffusion, and thin film growth techniques.

What is claimed is:

1. A non-volatile memory integrated circuit device comprising:
   a. a body of semiconductor material predominantly of one conductivity type, the body having a surface;
   b. a first well region having a conductivity type opposite that of the body, the first well region extending into the body from the surface;
   c. a second well region having a conductivity type opposite that of the body, the second well region extending into the body from the surface, wherein the first well region and second well region do not overlap;
   d. a source well region having a conductivity type the same as that of the body, the source well region extending into the body from the surface, wherein the source well region is contained within the first well region;
   e. a drain well region having a conductivity type the same as that of the body, the drain well region extending into the body from the surface, wherein the drain well is contained within the first well region, and wherein the source well region is separated from the drain well region by a distance;
   f. an insulation layer, wherein the insulation layer is formed on the surface;
   g. a floating gate, wherein the gate overlies the surface by an insulation distance, separated by an insulating material and wherein the floating gate substantially spans the distance and further substantially spans the second well region, wherein the floating gate comprises an uninterrupted electrical conducting path extending from the first well region to the second well region;

h. means for applying a program voltage to the first well region and to the source well region; and i. means for applying a program bias voltage to the second well region.

2. The device of claim 1, wherein the body of the semiconductor material is predominantly P-type conductivity, the first and second well region is predominantly N-type conductivity, and the source well region and drain well region is predominately P-type conductivity.

3. The device of claim 2, wherein the insulation distance is 30-100 angstroms.

4. The device of claim 3, wherein the program voltage is between 6.0-7.0 volts, the program bias voltage is between 1.9-2.2 volts, and the program drain voltage is between 0.0-0.3 volts.

5. The device of claim 2 comprising:
a. means for applying the program voltage to first well region and to the source well region;
b. means for applying the program bias voltage to the second well region; and
c. means for applying a substantially grounded voltage to the drain well region, wherein a program charge is stored on the floating gate as a result of electrons passing from the first well region, through the insulation layer, to the floating gate.

6. The device of claim 2 comprising:
a. means for applying an erase voltage to the first well region, to the drain well region, and to the source well region; and
b. means for applying a substantially grounded voltage to the second well region, wherein a charge stored on the floating gate traverses through the insulating layer to the first well region.

7. The device of claim 6, wherein the erase voltage is between 12.0-16.0 volts and the second region voltage is between 0.0-0.3 volts.

8. The device of claim 2 comprising:
a. means for applying an circuit source voltage to the source well region and the first well region;
b. means for applying a circuit drain voltage that is less than the circuit voltage to the drain region; and
c. means for applying a substantially grounded voltage to the second well region.

9. The device of claim 8, wherein the circuit voltage is between 3.3-5.0 volts and the substantially grounded voltage is between 0.0-0.3 volts.

10. The device of claim 2, further comprising:
at least one device selected from the group of an analog circuit device, a digital logic circuit device, or a processor circuit device, wherein all the devices are formed in a common substrate.

11. The device of claim 2, wherein the memory device is configured to perform read operations operating on a power supply voltage that is less than an erase voltage and a program voltage, wherein the second well is configured to operate with a second well bias voltage that is less than the power supply voltage.

12. The device of claim 11, wherein the second well region is configured to accept a voltage of 2.2 V or less.

13. The device of claim 1, wherein the body of the semiconductor material is predominantly N-type conductivity, the first and second well region is predominantly P-type conductivity, and the source well region and drain well region is predominately N-type conductivity.

14. The device of claim 1, further comprising:
at least one device selected from the group of an analog circuit device, a digital logic circuit device, or a processor circuit device, wherein all the devices are formed in a common substrate.

15. The device of claim 1, wherein the gate comprises a body, wherein the body is entirely supported by the insulation layer.

16. A method of fabrication a memory device comprising the steps of:
a. forming a body of semiconductor material predominantly of one conductivity type the body having a surface;
b. forming a first well region having a conductivity type opposite that of the body, the first well region extending into the body from the surface;
c. forming a second well region having a conductivity type opposite that of the body, the second well region extending into the body from the surface, wherein the first well and second well regions do not overlap;
d. forming a source well region having a conductivity type the same as that of the body, the source well region extending into the body from the surface, wherein the source well region is contained within the first well region;
e. forming a drain well region having a conductivity type the same as that of the body, the drain well region extending into the body from the surface, wherein the drain well is contained within the first well region, and wherein the source well region is separated from the drain well region by a distance;
f. forming an insulation layer on the surface;
g. forming a floating gate on the insulation layer, wherein the gate overlies the surface by an insulation distance, separated by an insulating material and wherein the floating gate substantially spans the distance and further substantially spans the second well region, wherein the floating gate comprises an uninterrupted electrical conducting path extending from the first well region to the second well region;
h. applying a program voltage to the first well region and to the source well region; and
i. applying a program bias voltage to the second well region.

17. The method of claim 16, wherein the formed body of the semiconductor material is predominantly P-type conductivity, the first and second well region is predominantly N-type conductivity, and the source well region and drain well region is predominately P-type conductivity.

18. The method of claim 17, wherein the wherein the formed insulation thickness is 30-100 angstroms.

19. The method of claim 17, further comprising the step of forming at least one device selected from the group of logic, analog, micro-controller/processor, or graphics processing devices, wherein the memory device is formed within the processing layers as of the at least one device.

20. The method of claim 16, wherein the formed body of the semiconductor material is predominantly N-type conductivity, the first and second well region is predominantly P-type conductivity, and the source well region and drain well region is predominately N-type conductivity.

21. The device of claim 16, wherein the gate comprises a body, wherein the body is entirely supported by the insulation layer.

* * * * *